United States Patent [19]
Miyake

[11] Patent Number: 5,981,989
[45] Date of Patent: Nov. 9, 1999

[54] SEMICONDUCTOR MEMORY DEVICE HAVING IMPROVED STACKED CAPACITOR CELLS

[75] Inventor: Hideharu Miyake, Tokyo, Japan

[73] Assignee: NEC Corporation, Tokyo, Japan

[21] Appl. No.: 08/312,395

[22] Filed: Sep. 26, 1994

Related U.S. Application Data

[63] Continuation of application No. 08/051,343, Apr. 23, 1993, abandoned.

[30] Foreign Application Priority Data

Apr. 24, 1992 [JP] Japan .................................... 4-131973

[51] Int. Cl.⁶ .......................... H01L 27/108; H01L 29/76; H01L 29/94; H01L 31/119
[52] U.S. Cl. ............................ 257/296; 257/301; 257/304
[58] Field of Search .................................... 257/296, 301, 257/304

[56] References Cited

FOREIGN PATENT DOCUMENTS

| 2 50476 | 2/1990 | Japan | 257/296 |
|---|---|---|---|
| 2 56965 | 2/1990 | Japan | 257/296 |
| 2106069 | 4/1990 | Japan | 257/296 |
| 4 27156 | 1/1992 | Japan . | |
| 4 58566 | 2/1992 | Japan | 257/296 |

Primary Examiner—Stephen D. Meier
Attorney, Agent, or Firm—Young & Thompson

[57] ABSTRACT

The invention provides a stacked capacitor cell structure for a semiconductor memory device. The cell includes a transistor formed in an active region in a surface of a semiconductor substrate; a first inter-layer insulator both overlying the transistor and having a contact hole over the transistor; a second inter-layer insulator both overlying the first inter-layer insulator and having a through hole with a larger diameter than the diameter of the contact hole; a stacked capacitor both formed within the through hole formed in the second inter-layer insulator and comprising a storage electrode electrically connected to the transistor through the contact hole, a capacitive insulation film and an opposite electrode; and a third inter-insulator overlying both the stacked capacitor and the second inter-layer insulator.

6 Claims, 8 Drawing Sheets

SEMICONDUCTOR MEMORY DEVICE HAVING IMPROVED STACKED CAPACITOR CELLS

This application is a continuation of application Ser. No. 08/051,343, filed Apr. 23, 1993, now abandoned.

BACKGROUND OF THE INVENTION

The invention relates to a semiconductor memory device, and more particularly to an improvement in high density stacked capacitor cells for a dynamic random access memory (DRAM).

The importance of high integration of a stacked capacitor cell array for the dynamic random access memory has been on the increase in the semiconductor technology. An improvement in the high integration of the stacked capacitor cell array in the dynamic random access memory device requires each memory cell to occupy a small area as much as possible. The each memory cell includes a stacked capacitor serving as a storage capacitor and a field effect transistor serving as a switching transistor. Concurrently, a security of a predetermined capacitance is essential to support an excellent performance of the each stacked capacitor as a storage capacitor in the each memory cell. Scaling down of the each stacked capacitor and thus high density of the stacked capacitor cell array is essential to allow the memory cell array device or the dynamic random access memory device to exhibit excellent and high level performances as the memory device. The security of a predetermined capacitance or a relatively large capacitance for the each stacked capacitor is also essential to provide both a high reliability and a excellent performance to the stacked capacitor memory cell array device or the dynamic random access memory device. Many structures about the stacked capacitor have been proposed for improvements both in the high integration of the stacked capacitor cell array and in the enlargement of the capacitance of each the stacked capacitor in the dynamic random access memory device.

A typical structure of each stacked capacitor memory cell in a conventional dynamic random access memory device will be described with reference to FIG. 1. The structure of the each stacked capacitor cell in the dynamic random access memory device has a p-type silicon substrate 301. Field oxide films 302 are selectively formed in a surface area of the p-type silicon substrate 301 thereby an active region for formation of the stacked capacitor cell is defined in the surface area of the p-type silicon substrate 301. Both a gate oxide film 303 and a gate electrode 304 which exists on the gate oxide film 303 are formed in a predetermined area in the active region of the p-type silicon substrate 301. Further, n-type diffusion regions 305-1 and 305-2 to serve as source and drain regions are formed in the active region except for an area directly under the gate oxide film 303 and the gate electrode 304 thereby a channel region directly under both the gate oxide film 303 and the gate electrode 304 is defined by the n-type source and drain diffusion regions 305-1 and 305-2. A first inter-layer insulator 306 is so formed as to overlay an entire surface of the device, for example, the field oxide film 302, the n-type source and drain diffusion regions 305-1 and 305-2 and the gate electrode 304. The first inter-layer insulator 306, however, has a through hole directly over the source or drain diffusion region 305-1. A storage capacitor 308 for a stacked capacitor cell is so formed as to contact to the n-type source or diffusion region 305-1 through the contact hole of the first inter-layer insulator 306. The storage electrode 308 of the stacked capacitor cell has a vertical side wall above the first inter-layer insulator 306 such as to have a relatively large height as compared to its size. A capacitive insulation film 309 for the stacked capacitor is so formed as to cover an exposed surface of the storage electrode 308 above the first inter-layer insulator 306. Further, an opposite electrode 310 for the stacked capacitor is so formed as to overlay the capacitive insulation film 309 thereby resulting in a formation of the stacked capacitor in the memory cell. The capacitance of the stacked capacitor is formed by a combination of the storage and opposite electrodes 308 and 310 through the capacitive oxide film 309. A second inter-layer insulator 307 is so formed as to overlie an entire surface of the device, for example, the first inter-layer insulator 306 and the opposite electrode 310 of the stacked capacitor.

Actually, a plurality of word-lines and bit-lines are formed over the second inter-layer insulator 307, although illustrations thereof are omitted from FIG. 1. The plural word-lines and bit-lines are, of course, electrically separated from each other. The word-lines are crossed to the bit-lines with an overpass. The bit-lines comprise wiring layers made of polycide. The word-lines also comprise wiring layers but made of aluminium which provide a low resistance to the word-lines. The n-type source or drain diffusion region 305-2 is connected to the bit-line, although an illustration of this connection between the bit-line and the n-type source or drain diffusion region 305-2 is omitted from FIG. 1.

Digital signals are transmitted through any one of the plural bit-lines to the n-type source or drain diffusion region 305-2 of the transistor. When the transistor takes ON state, the digital signal is transmitted though the channel region to the n-type source or drain diffusion region 305-1, and subsequently transmitted into the storage electrode 308 of the stacked capacitor. The transistor turns OFF thereby the digital signal is stored in the storage electrode 308 of the stacked capacitor.

With respect to the capacitance of the stacked capacitor, a value of the capacitance of the stacked capacitor depends upon a size of a surface area of the capacitive oxide film 309 which is sandwiched between the storage and opposite electrodes 308 and 310. A security of a large area of interfaces of the capacitive oxide film 309 to the storage and opposite electrodes 308 and 310 provides a large capacitance to the stacked capacitor. A small occupied area of the stacked capacitor allows the accomplishment of the high integration of the stacked memory cell array. The storage electrode 308 of the stacked capacitor having the side portion abutting the capacitive oxide film 309 of the stacked capacitor is so designed that the side portion of the storage electrode 308 has such a large height as to secure a large area of the interface of the storage electrode 308 to the capacitive oxide film 309 under the condition of a small occupied area of the stacked capacitor. Such security of the large area of the interfaces of the capacitive oxide film 309 to the storage and opposite electrodes 308 and 310 for the stacked capacitor under the condition of the small occupied area of the stacked capacitor not only permits the accomplishment of the high integration of the memory cell array but also provides a required capacitance relatively large as compared to the stacked capacitor.

Such structure of the stacked capacitor cell for the dynamic random access memory device is, however, engaged with the following disadvantages. As illustrated in FIG. 1, a surface of the second inter-layer insulator 307 exhibits a large difference in level at a boundary area between a memory cell area and a peripheral area. Namely, the surface of the second inter-layer insulator 307 over the stacked capacitor exists above the surface of the second inter-layer insulator 307 over the field oxide film 302. As described the above, the bit-lines and the word-lines are formed over the second inter-layer insulator 307. That is why the bit-lines and the word-lines also have such a difference in level as the large difference in level of the second inter-layer insulator 307. Such large difference in level of the second inter-layer insulator 307 is caused from the large height of the vertical side wall of the stacked capacitor above the inter-layer insulator 306. Although such structure of the stacked capacitor having the vertical side wall with the large height allows the above requirements concerned with the small occupied area and the large capacitance of the stacked capacitor to be satisfied, the large height of the vertical side wall of the stacked capacitor above the first inter-layer insulator 306 provides the large differences in level not only to the second inter-layer insulator 307 but also to the word-lines and the bit-lines above the first inter-layer insulator 306. The large difference in level of the wiring layers of the bit-lines or the word-lines causes the following problems in both the high integration and the high reliability of the dynamic random access memory device.

One of the most important factors for accomplishment of the scaling down of the each memory cell, which allows the high integration of the memory cell array in the dynamic random access memory device, is the accuracy of patterning provided by a photo-lithography process. Namely, how much scaling down of the dynamic random access memory is achievable depends upon a grade of the accuracy of the patterning provided by the present photo-lithography technique. The grade of the accuracy of the patterning provided by the photo-lithography depends upon a degree of leveling of a surface of a layer which is exposed to ultraviolet rays for the patterning by the photo-lithography. A high grade leveling of a surface of a layer to be exposed to the patterning by the photo-lithography allows an accomplishment of a high accuracy of the patterning by the photo-lithography. In contrast, a low grade leveling of a surface of a layer to be exposed to the patterning by the photo-lithography does not allow any accomplishment of a high accuracy of the patterning by the photo-lithography. Namely, a large difference in level of a surface of a layer to be exposed to the patterning by the photo-lithography makes the accuracy of the patterning by the photo-lithography inferior. A fine pattern or a high grade accuracy of the patterning by the photo-lithography is essential for improvement in the scaling down of the device. Inferiority of the accuracy of the patterning by the photo-lithography makes it difficult to improve the scaling down of the device. Existence of a large difference in level of a surface of a layer in the device, thus, provides the inferiority to the accuracy of the patterning by the photo-lithography and thus resulting in a difficulty in the scaling down of the device, although the scaling down is necessary for improvement in the high integration of the device. Elimination of the difference in level and thus implementation of a high grade leveling of a surface of each layer in the device is essential for improvement in the scaling down which allows a high integration of the device.

Indeed, as understood from FIG. 1, the conventional dynamic random access memory cell device has a remarkable difference in level of the second inter-layer insulator 307 at the boundary area between the memory cell area and the peripheral area. That is why the bit-lines and the word-lines which are formed over the second inter-layer insulator 307 also have such a remarkable difference in level which causes the inferiority in the accuracy of the patterning by the photo-lithography. The inferiority in the accuracy of the patterning by the photo-lithography for the bit-lines and the word-lines provides a restriction to the improvement in the scaling down of the dynamic random access memory device thereby resulting in an inferior yield of the device.

Accomplishment of an excellent leveling for a surface of each layer, particularly the second inter-layer insulator 307, wiring-layers such as bit-lines and word-liners is, therefore, essential to improve a high integration of the memory cell device such as stacked capacitor cell random access memory device.

It is, thus, required to develop a novel stacked capacitor memory cell device for memory cell array of a random access memory device, which allows a leveled surface of each layer, particularly the second inter-layer insulator 307, wiring-layers such as bit-lines and word-liners.

OBJECTS OF THE INVENTION

Accordingly, it is a primary object of the present invention to provide a novel semiconductor memory device.

It is a further object of the present invention to provide a novel memory cell structure for a semiconductor memory device.

It is a still further object of the present invention to provide a novel stacked capacitor structure for each memory cell in a dynamic random access memory device in which the stacked capacitor has a large capacitance.

It is yet a further object of the present invention to provide a novel stacked capacitor structure for each memory cell in a dynamic random access memory device in which the stacked capacitor has a small occupied area.

It is a further more object of the present invention to provide a novel stacked capacitor structure for each memory cell in a dynamic random access memory device in which the stacked capacitor structure allows improvement in a high integration of stacked capacitor memory cells in a dynamic random access memory device.

It is another object of the present invention to provide a novel stacked capacitor structure for each memory cell in a dynamic random access memory device in which the stacked capacitor structure allows an excellent leveling of a surface each layer over the stacked capacitor.

It is still another object of the present invention to provide a novel stacked capacitor structure for each memory cell in a dynamic random access memory device in which the stacked capacitor structure allows an excellent leveling of a surface each wiring layer such as bit-line or word-line.

It is an additional object of the present invention to provide a novel fabrication method of an improved stacked capacitor memory cell structure for a dynamic random access memory device.

SUMMARY OF THE INVENTION

The above and other objects, features and advantages of the present invention will be apparent from the following descriptions.

The present invention provides a stacked capacitor cell structure for a semiconductor memory device. The structure has a semiconductor substrate. A field oxide film is selectively formed in a surface region in the semiconductor substrate so as to define an active region in the surface region of the semiconductor substrate. A transistor is formed in the active region. A first inter-layer insulator overlies both the transistor and the field oxide film. The first inter-layer insulator has a contact hole with a diameter over the transistor. A second inter-layer insulator overlies the first inter-layer insulator. The second inter-layer insulator both has a through hole with a larger diameter than the diameter of the contact hole and has a large thickness as compared to the first inter-layer insulator and the field oxide film. A stacked capacitor is formed within the through hole formed in the second inter-layer insulator. The stacked capacitor comprises a storage electrode electrically connected to the transistor through the contact hole formed in the first inter-layer insulator, a capacitive insulation film and an opposite electrode. A third inter-layer insulator overlies both the stacked capacitor and the second inter-layer insulator. The third inter-layer insulator has a flat surface.

Preferably, the storage electrode, the capacitive insulation film and the opposite electrode are formed along respective surfaces of the through hole and the contact hole.

Alternatively, the storage electrode comprises, a first portion formed on a surface of the through hole, a second portion formed at a center of the through hole and a third portion formed within the contact hole whereby the first and second portions form an aperture. The capacitive insulation film overlies respective surfaces of said first and second portions of the storage electrode. The opposite electrode overlies the capacitive insulation film.

The third inter-layer insulator has a difference in level at least smaller than a total thickness of the capacitive insulation film and the opposite electrode. The third inter-layer insulator includes a layer made of boro-phospho silicate glass that has been subjected to a re-flow treatment for an improvement in leveling the surface of the third inter-layer insulator.

BRIEF DESCRIPTION OF THE DRAWINGS

The preferred embodiments of the present invention will herein after fully be described in detail with reference to the accompanying drawings.

PREFERRED EMBODIMENTS OF THE INVENTION

The present invention provides a novel structure of each stacked capacitor cell involved in a dynamic random access memory device. A stacked capacitor is formed in an opening formed in an insulation film serving as an inter-layer insulator so that an insulation film over the stacked capacitor is free from a difference in level which is caused by an existence of the stacked capacitor.

A first embodiment of the present invention will be described in detail with reference to FIGS. 2 and 3A to 3F.

Figure 1:
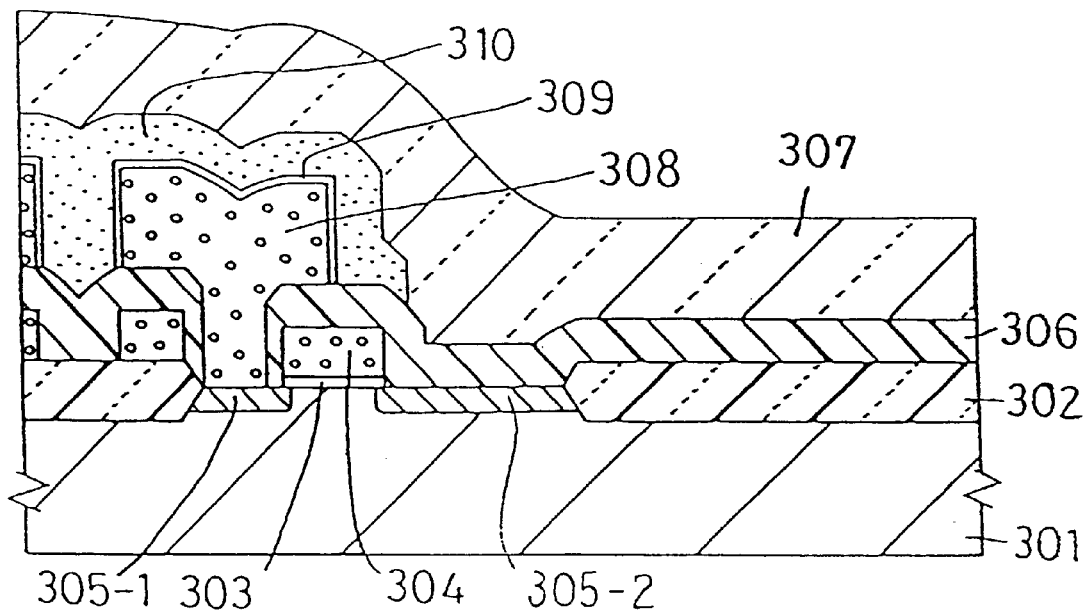
FIG. 1 is a fragmentary cross sectional elevation view illustrative of the structure of the conventional stacked capacitor memory cell involved in the random access memory device.
Figure 2:
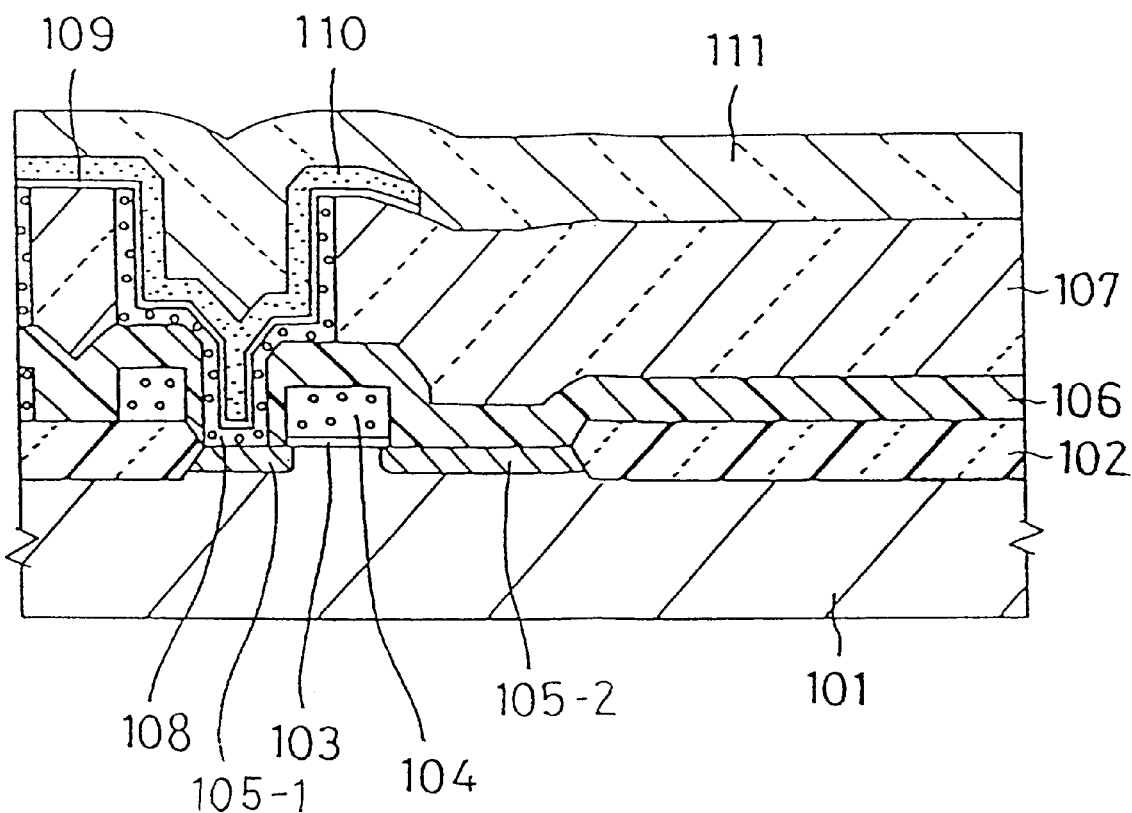
FIG. 2 is a fragmentary cross sectional elevation view illustrative of a structure of a novel stacked capacitor memory cell involved in a random access memory device in a first embodiment according to the present invention.

A novel structure of each stacked capacitor memory cell involved in a dynamic random access memory will be described with reference to FIG. 2. The novel stacked capacitor memory cell for the dynamic random access memory device has a p-type silicon substrate 101. A field oxide film 102 is selectively formed in a surface of the p-type silicon substrate 101 thereby an active region which comprises an exposed surface of the p-type silicon substrate 101 is defined. Namely, the opposite surface region to the active region in the p-type silicon substrate 101 is covered with the field oxide film 102. A gate oxide film 103 is formed in a predetermined region of the active region in the surface of the p-type silicon substrate 101. A gate electrode 104 exists directly over the gate oxide film 103. The active region, except for a covered area by the gate oxide film 103, is occupied by source and drain diffusion regions 105-1 and 105-2 of n-type. Thus, a transistor which comprises the n-type source and drain diffusion regions 105-1 and 105-2 and the gate electrode 104 is formed on the active region in the surface of the p-type silicon substrate 101.

A first inter-layer insulator 106 which comprises an insulation film 102 overlies not only the field oxide film but the transistor for memory cell thereby the n-type source or drain diffusion region 105-2 and the gate electrode 104 are covered by the first inter-layer insulator 106. The first inter-layer insulator 106, however, has a contact hole which exists directly over the source or drain diffusion region 105-1 in the transistor. Further, a second inter-layer insulator 107 overlies the first inter-layer insulator 106. The second inter-layer insulator 107, however, has a through hole which exists directly over the contact hole of the first inter-layer insulator 106. The through hole of the second inter-layer insulator 107 has a much larger diameter than a diameter of the contact hole of the first inter-layer insulator 106. Both the contact hole of the first inter-layer insulator 106 and the through hole of the second inter-layer insulator 107 have respectively vertical side walls. Thus, a part of the first inter-layer insulator 106 is exposed but only in the vicinity of the contact hole. The second inter-layer insulator 107 has a much larger thickness than a thickness of the first inter-layer insulator 106. Thus, the n-type source or drain diffusion region 105-1 is exposed through both the contact hole of the first inter-layer insulator 106 and the through hole of the second inter-layer insulator 107.

A stacked capacitor of the memory cell is formed in both the contact hole of the first inter-layer insulator 106 and the through hole of the second inter-layer insulator 107. A storage electrode 108 of the stacked capacitor is formed in both the contact hole of the first inter-layer insulator 106 and the through hole of the second inter-layer insulator 107. For example, the storage electrode 108 which comprises a polycrystalline silicon film overlies the vertical side wall of the through hole formed in the second inter-layer insulator 107. The storage electrode 108 further overlies both the vertical side wall of the contact hole and the exposed surface in the vicinity of the contact hole in the first inter-layer insulator 106. The storage electrode 108 furthermore overlies the exposed part of the source or drain diffusion region 105-1 so as to make the storage electrode 108 into contact with the source or drain diffusion region 105-1 electrically. A capacitive insulation film 109 which comprises an insulation film for the stacked capacitor overlies the storage electrode 108 which is formed in both the through hole and the contact hole of the second and first inter-layer insulators 107 and 106 respectively. An opposite electrode 110 which comprises a polycrystalline silicon film for the stacked capacitor overlies the capacitive insulation film 109 for the stacked capacitor. The stacked capacitor has a large area of interfaces of the capacitive insulation film 109 to both the storage electrode 108 and the opposite electrode 110 so as to allow the stacked capacitor to possess a large capacitance under a small occupied area.

A third inter-layer insulator 111 covers an entire surface of the device, and thus the stacked capacitor and the second inter-layer insulator 107. The third inter-layer insulator 111 has an insufficient difference in level over the stacked capacitor. Such insufficient difference in level of the third inter-layer insulator 111 is caused by a total thickness of both the capacitive insulation film 109 and the opposite electrode 110. The existence of the stacked capacitor in the through hole and the contact hole of the second and first inter-layer insulators 107 and 106 allows the third inter-layer insulator 111 over the stacked capacitor to be free from a large or remarkable difference in level. A sufficient thickness of the second inter-layer insulator 107 permits the vertical side wall of the through hole of the second inter-layer insulator 107 to have a large area which provide a large capacitance to the stacked capacitor under the condition of a small occupied area.

Previous to an investigation of advantages provided from such novel structure of the stacked capacitor memory cell for the dynamic random access memory device, a fabrication method of the novel stacked capacitor cell will subsequently be described with reference to FIGS. 3A to 3F.

Figure 3A:
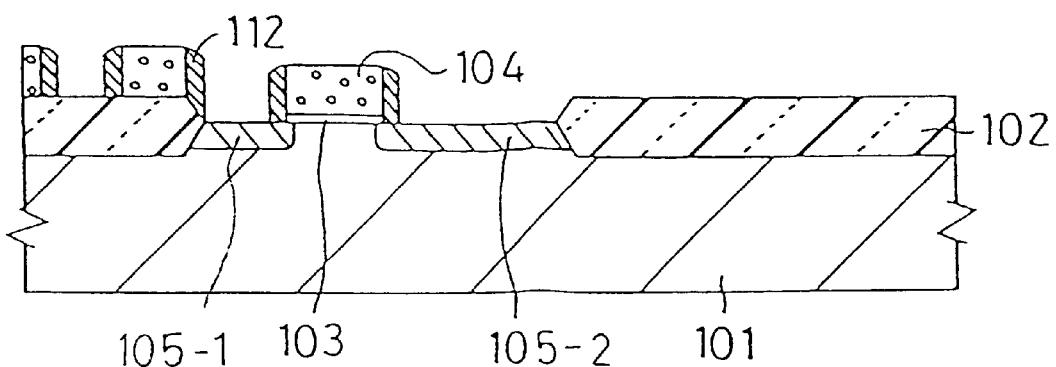
FIGS. 3A to 3F are fragmentary cross sectional elevation views illustrative of sequential steps involved in a novel fabrication method of the stacked capacitor memory cell for a random access memory device, illustrated in FIG. 2 of the first embodiment according to the present invention.

With reference to FIG. 3A, the p-type silicon substrate 101 is prepared for a subsequent process of local oxidation of silicon (LOCOS) thereby the field oxide film 102 having a thickness of approximately 400 nanometers is selectively formed in a surface region except for an active region of the p-type silicon substrate 101. Thus, the active region of the surface of the p-type silicon substrate 101 is defined and isolated by the field oxide film 102. Ion-implantation to the active region in the surface of the p-type silicon substrate 101 is accomplished for controlling a threshold voltage of a transistor.

The active region in the surface of the p-type silicon substrate 101 is subjected to a thermal oxidation so that the gate oxide film 103 having a thickness of approximately 15 nanometers is formed on the active region. A polycrystalline silicon film having a thickness of approximately 300 nanometers is grown on the gate oxide film 103 for a subsequent phosphorus diffusion into the polycrystalline silicon film such as to make the polycrystalline silicon film have a desired low resistivity. After that, the gate oxide film 103 and the polycrystalline silicon film are subjected to such a patterning by photo-lithography as to make the gate oxide film 103 and the polycrystalline silicon film remain on a predetermined region only in the active region. The remaining polycrystalline silicon film serves as the gate electrode 104.

Ion-implantation of n-type dopant and a subsequent diffusion are accomplished by a normal process such as self-alignment technique so that lightly doped diffusion regions of n$^-$-type are formed in the active region except for a surface region directly under the gate oxide film. Subsequently, side wall oxide films 112 are formed at opposite side portions of the gate electrode 104. After that, an ion-implantation of n-type dopant and a subsequent diffusion are accomplished by a normal process such as self-alignment technique so that the n$^+$-type diffusion regions 105-1 and 105-2 are formed in the n$^-$-type lightly doped diffusion regions so that the n -type lightly doped diffusion regions remain only at potions directly under the side wall oxide films 104. As a result, the n-type source and drain diffusion regions 105-1 and 105-2 which includes a lightly doped drain structure are formed thereby a channel region of the transistor is defined. Consequently, a filed effect transistor which serves as a switching device for the memory cell is formed in the active region. The lightly doped drain structure of any of the n-type source and drain diffusion regions 105-1 and 105-2 is able to reduce a maximum electric field appearing at a drain side so as to prevent both a generation of hot carriers and a subsequent injection of the hot carriers into the gate oxide film. Such lightly doped drain structure of each of the n-type source and drain diffusion regions 105-1 and 105-2 allows a scaling down of a channel length of the field effect transistor.

Figure 3B:
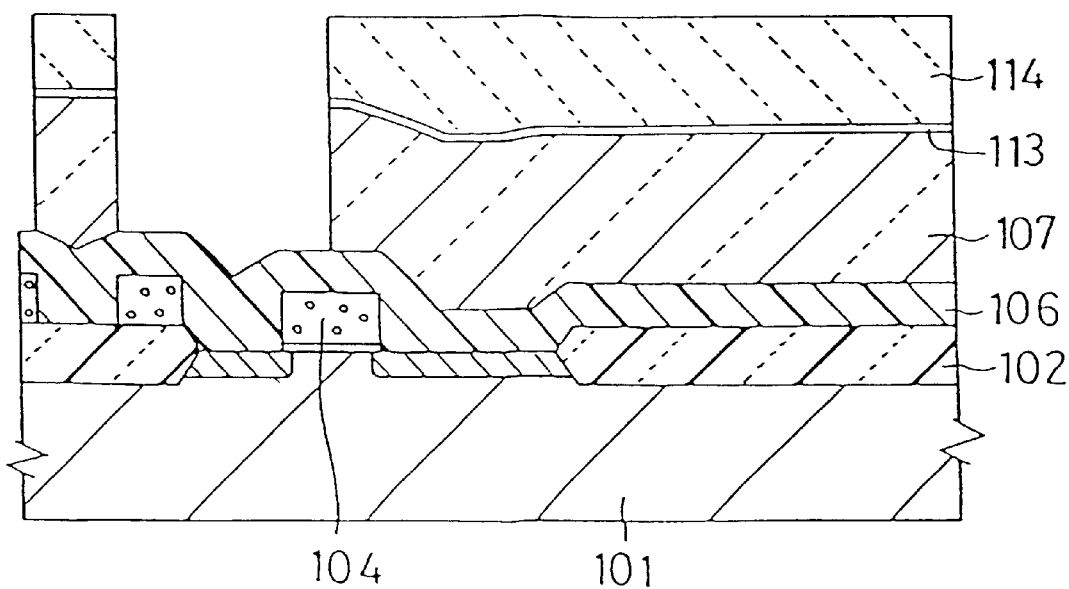

With reference to FIG. 3B, the first inter-layer insulator 106 which comprises a silicon oxide film having a thickness of approximately 250 nanometers is grown on an entire surface of the device so as to cover not only the transistor in the active region but the filed oxide film 102. The second inter-layer insulator 107 which comprises a boro-phospho silicate glass film (BPSG film) having a thickness of approximately 600 nanometers is further grown on the first inter-layer insulator 106 for a subsequent re-flow process for leveling the surface of the second inter-layer insulator 107. The boro-phospho silicate glass film (BPSG film) is likely to exhibit a commencement of a re-flow phenomenon at a relatively low temperature as compared to a phospho-silicate glass film. A silicon nitride film 113 having a thickness of approximately 30 nanometers is grown on the second inter-layer insulator 107.

A photo-resist 114 which has been patterned is prepared for a subsequent alignment of the photo-resist 114 on the silicon nitride film 113 such that an opening of the photo-resist 114 exists directly over the n-type source or drain diffusion region 105-1. A dry etching to the silicon nitride film 113 and the second inter-layer insulator 107 is accomplished by using the patterned photo-resist 114 as a mask so that the silicon nitride film 113 and the second inter-layer insulator 107 but only directly under the opening of the patterned photo-resist 114 are selectively removed. As a result, a through hole is formed in the second inter-layer insulator 107 directly under the opening of the photo-resist 114. Thus, a diameter of the through hole formed in the second inter-layer insulator 107 is defined by a diameter of the opening of the patterned photo-resist 114. An etching rate of the boro-phospho silicate glass film serving as the second inter-layer insulator 107 is larger than an etching rate of the silicon oxide film serving as the first inter-layer insulator 106. Thus, a suitable adjustment of a time for the above dry etching allows the first inter-layer insulator 106 to remain thereby a surface of the first inter-layer insulator is partially exposed through the through hole of the second inter-layer insulator 107 and the opening of the patterned photo-resist 114. The through hole formed in the second inter-layer inter-layer insulator 107 has a vertical side wall having a large height which is defined by the thickness of the second inter-layer insulator 107. After a completion of the above dry etching process, the photo-resist 114 is removed.

Figure 3C:
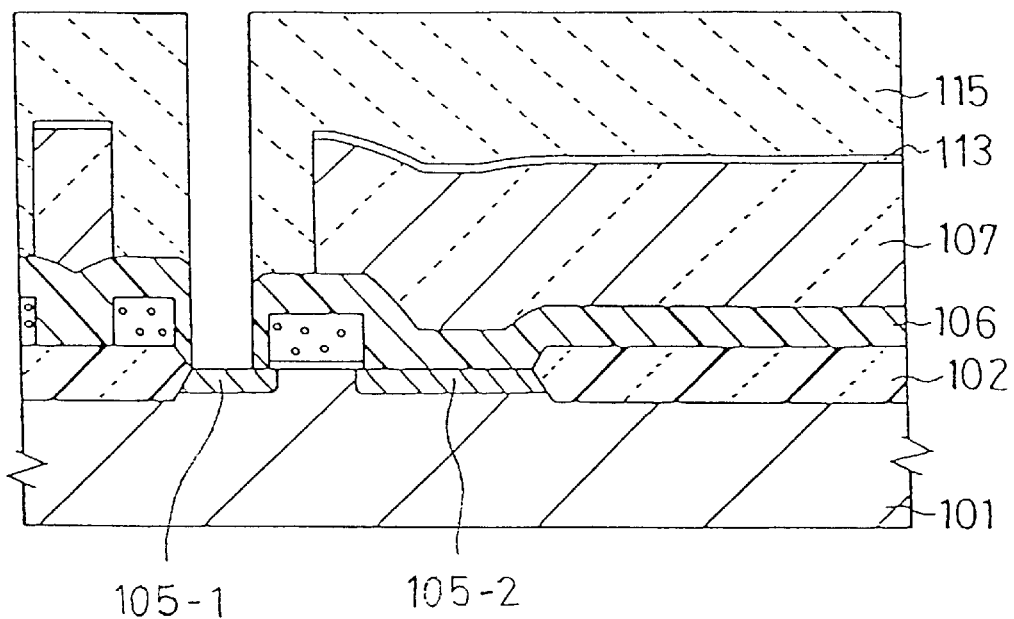

With reference to FIG. 3C, a photo-resist 115 which has been patterned is prepared for such a subsequent alignment of the photo-resist 115 that an opening of the photo-resist 115 exists directly over the n-type source or drain diffusion region 105-1. The opening of the patterned photo-resist 115 has a smaller diameter than a diameter of the through hole formed in the second inter-layer insulator 107. That is why the photo-resist 115 covers not only the silicon nitride film 113 but also the vertical side wall and a part of a bottom of the through hole. An etching to the first inter-layer insulator 106 is accomplished by using the patterned photo-resist 115 as a mask so that the first inter-layer insulator 106 but only directly under the opening of the patterned photo-resist 115 are selectively removed. As a result, a contact hole is formed in the first inter-layer insulator 108 directly under the opening of the patterned photo-resist 115. Thus, a diameter of the contact hole formed in the first inter-layer insulator 106 is defined by a diameter of the opening of the patterned photo-resist 115. As a result, a surface of the source or drain diffusion region 105-1 is partially exposed through the contact hole of the first inter-layer insulator 106 and the opening of the photo-resist 115. The contact hole formed in the first inter-layer insulator 106 has a vertical side wall having a height which is defined by a total thickness of the first inter-layer insulator 107 and the gate electrode 104. After a completion of the above etching process, the photo-resist 115 is removed.

Figure 3D:
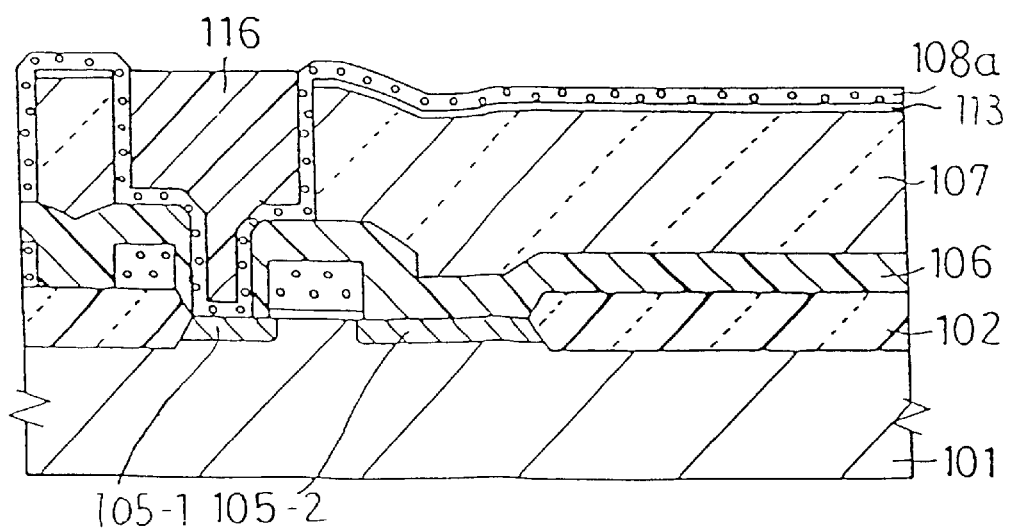

With reference to FIG. 3D, a polycrystalline silicon film 108a having a thickness of approximately 100 nanometers is grown on an entire surface of the device so as to cover not only the silicon nitride film 113 but also respective surfaces of through hole formed in the second inter-layer insulator 107 and the contact hole formed in the first inter-layer insulator 106. Namely, the polycrystalline silicon film 108a covers not only the respective vertical side walls of the through hole and the contact hole but also the exposed surface of the n-type source or drain diffusion region 105-1, in addition the bottom portion of the through hole which comprises the first inter-layer insulator 106. As a result, the polycrystalline silicon film 108a is made into contact with the n-type source and drain diffusion region 105-1.

Subsequently, a low pressure chemical vapor deposition (LPCVD) of silicon oxide is accomplished thereby a silicon oxide film 116 having a thickness of approximately 500 nanometers is grown on the polycrystalline silicon film 108a. As a result, the silicon oxide film 116 fills the through hole and the contact hole formed in the second and first inter-layer insulators 105-1 and 105-2. An entire surface of the deposited silicon oxide film 116 is subjected to etch-back thereby the silicon oxide film 116 is removed so partially as to remain only within the through hole in the second inter-layer insulator 107 and the contact hole in the first inter-layer insulator 106.

Figure 3E:
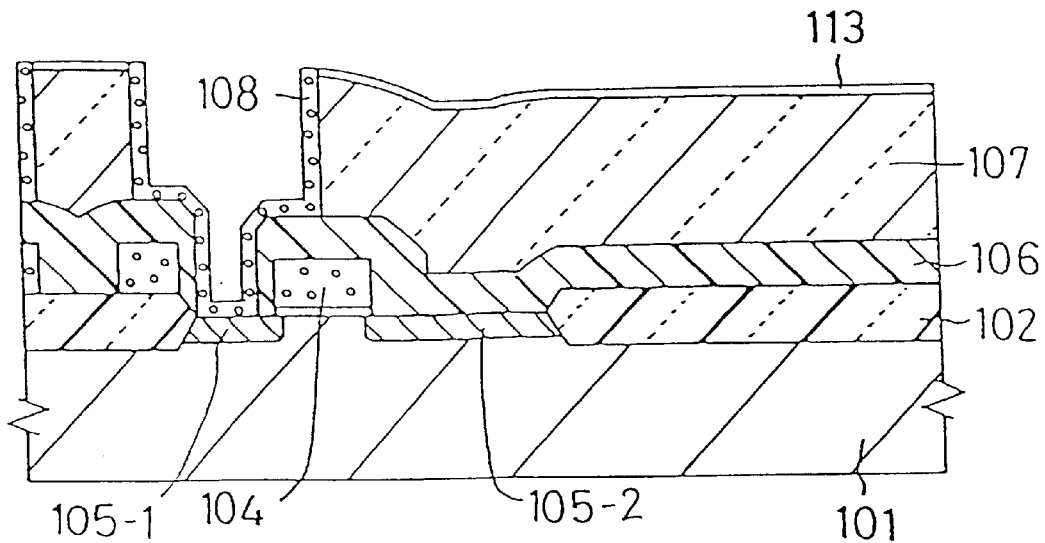

With respect to FIG. 3E, an etching to the polycrystalline silicon film 108a is accomplished by using the remaining silicon oxide film 116 within the through hole and the contact hole as a mask so that the polycrystalline silicon film 108a is subjected to such a patterning as to remain within the through hole and the contact hole. Thus, the polycrystalline silicon film 108a on the silicon nitride film 113 is removed thereby a surface of the silicon nitride film 113 is exposed. The remaining polycrystalline silicon film 108a serves as the storage electrode 108 for the stacked capacitor. After a completion of the etching, the oxide film 116 within the through hole and the contact hole are removed by etching. At this time, the silicon nitride film 213 having a resistivity to the etching serves to protect the second inter-layer insulator 107 which comprises the boro-phospho silicate glass film from the etching.

Figure 3F:
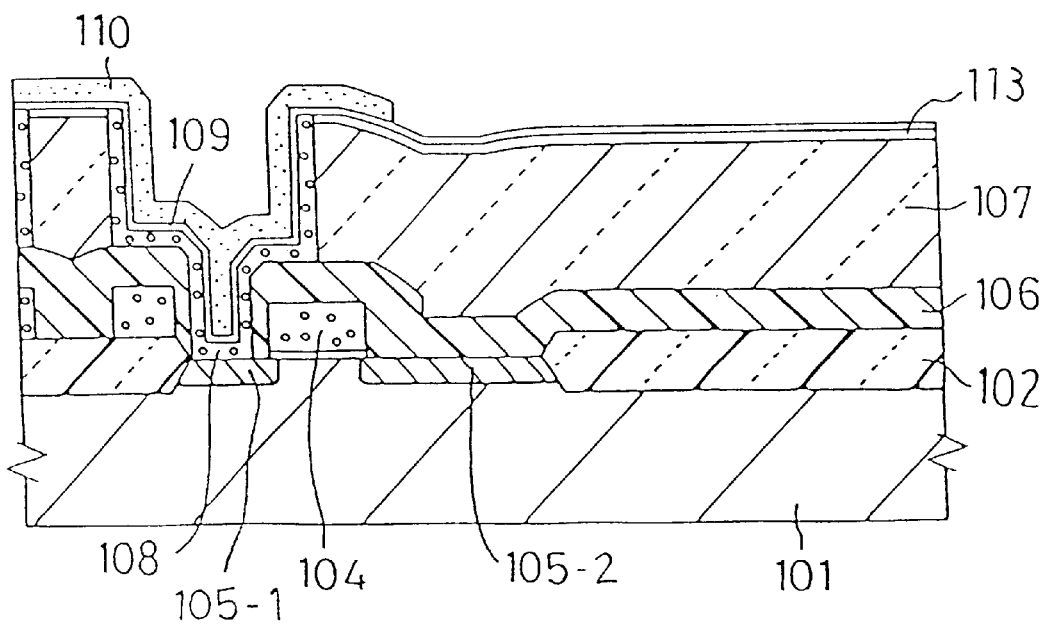

With respect to FIG. 3F, a silicon nitride film having a thickness of approximately 9 nanometers is grown on an entire surface of the device so as to cover not only the silicon nitride film 113 but also the storage electrode 108 of the stacked capacitor within the though hole and the contact hole for a subsequent thermal oxidation to the surface of the silicon nitride film thereby a silicon oxide film having a thickness of approximately 2 nanometers is formed on the surface of the silicon nitride film. As a result, a silicon oxide film covers not only the silicon nitride film 113 but the storage electrode 108 which comprises the remaining the polycrystalline silicon film. Further, a polycrystalline silicon film having a thickness of approximately 150 nanometers is grown on an entire surface of the device, and thus on the surface of the silicon oxide film for a subsequent doping of dopant into the polycrystalline silicon film such that the polycrystalline silicon film has a desirable resistivity. After that, the polycrystalline silicon film, the silicon oxide film and the silicon nitride film are subjected to such a patterning as to remain within and in the vicinity of the through hole as well as the contact hole. As a result, the capacitive insulation film 109 and the opposite electrode 110 are respectively formed on the storage electrode 108. The staked capacitor, thus, comprises the storage electrode 108, the capacitive insulation film 109 overlaying the storage electrode 108 and the opposite electrode 110 overlaying the capacitive insulation film 109. The above stacked layers, and thus the storage electrode 108, the capacitive insulation film 109 and the opposite electrode 110 exist along the respective surfaces of both the through hole in the second inter-layer insulator 107 and the contact hole in the first inter-layer insulator 106. This allows the stacked capacitor to have a large area of the interface between the capacitive insulation film 109 and the storage electrode 108 or the opposite electrode 110. This is why the stacked capacitor has a large capacitance with a small occupied area.

With reference back to FIG. 2, a silicon oxide film having a thickness of approximately 100 nanometers is grown on an entire surface of the device so as to cover not only the silicon nitride film on the second inter-layer insulator 107 but also the stacked capacitor, for example, the opposite electrode 110. Further, a boro-phospho silicate glass film is grown on the silicon oxide film for a subsequent heat treatment to make the boro-phospho silicate glass film exhibit a re-flow thereby resulting in a reduction of a difference in level of the surface of the boro-phospho silicate glass film. As a result, the third inter-layer insulator 111 having an insufficient difference in level is formed.

Subsequently, the following steps will be accomplished, although illustrations are omitted. A plurality of bit-lines which comprise wiring layers made of polyside are formed on the third inter-layer insulator 111. A contact hole is formed in the first, second and third inter-layer insulators 106, 107 and 111. Each of the plural bit lines is electrically connected to the n-type source or drain diffusion region 105-2 through the contact hole. An inter-layer insulator is formed on the polycide wiring layer serving as the bit-lines. After that, a plurality of word-lines which comprise wiring layers made of aluminium are formed on the inter-layer insulator over the bit-lines. A contact hole is formed in the top inter-layer insulator, the first, second and third inter-layer insulators 106, 107 and 111. Each of the plural word-lines is electrically connected to the polycrystalline silicon film serving as the gate electrode 104 through the contact hole. A passivation film is so formed as to cover the entire surface of the device including the word-lines thereby resulting in a completion of a formation of the stacked capacitor cell for the dynamic random access memory.

Digital signals are transmitted through the bit-lines to the source or drain diffusion region 105-2 of the transistor. If the transistor takes ON state, the digital signal is transmitted through the channel region to the source or drain diffusion region 105-1 and subsequently appears at the storage electrode 108 of the stacked capacitor. The digital signal is stored in the storage capacitor during OFF state of the transistor.

Advantages of the novel stacked capacitor cell for the dynamic random access memory device provided by the first embodiment according to the present invention will be described hereafter in detail.

As described above, the stacked capacitor is formed in the through hole of the second inter-layer insulator 107 and the contact hole of the first inter-layer insulator 106. For example, the storage electrode 108 and the opposite electrode 110, both of which sandwich the capacitive insulation film 109, exist both on the vertical side wall and the bottom portion of the through hole formed in the second inter-layer insulator 107 and on the vertical side wall of the contact hole formed in the first inter-layer insulator 106. That is why the stacked capacitor has a large area of the interface between the capacitive insulation film 109 and the storage electrode 108 or the opposite electrode 110. This allows the staked capacitor to have a large capacitance under a small occupied area. Further, the height of the vertical side wall of the through hole formed in the second inter-layer insulator 107 is defined by the thickness of the second inter-layer insulator 107. A variation of the thickness of the second inter-layer insulator 107 is permissive in view of a device design. It is possible to enlarge the capacitance of the stacked capacitor by an enlargement of the height of the vertical side wall of the through hole and thus an enlargement of the thickness of the second inter-layer insulator 107. The capacitance of the stacked capacitor is controllable by controlling the thickness of the second inter-layer insulator 107.

The insufficient difference in level of the surface of the third inter-layer insulator 111 is caused by the total thickness of the capacitive insulation film 109 and the opposite electrode 110 of the stacked capacitor. Further, the third inter-layer insulator 111 was subjected to a heat treatment which makes the boro-phospho silicate glass film of the third inter-layer insulator 111 exhibit a re-flow thereby resulting in a reduction of the insufficient difference in level of the surface of the third inter-layer insulator 111, and thus the leveling thereof is further improved. Such extremely insufficient difference in level of the third inter-layer insulator 111 allows layers over the third inter-layer insulator 111 such as the bit-lines and the word-lines to be free from having a difference in level thereof. Namely, an excellent leveling for the bit-lines and the word-lines and the other layers over the third inter-layer insulator 111 is realized. This makes the bit-lines and the word-lines free from any disconnection which is caused from a relatively large difference in level thereof. Further, such excellent leveling of the layers such as the bit-lines and the word-lines is able to keep any layer to be exposed to patterning of the photo-lithography from suffering any inferiority in the accuracy of patterning which is caused from a difference in level of a surface of the layer. This results in an improvement in the accuracy of the patterning in the photo-lithography. Such improvement in the accuracy of the patterning of the photo-lithography permits a further scaling down of the stacked capacitor cell for the dynamic random access memory device. This is why a high integration of the stacked capacitor memory cell array of the dynamic random access memory device is improved. Further, a reliability of the stacked capacitor memory cell is improved. Furthermore, a yield of the dynamic random access memory device is improved.

A second embodiment of the present invention will be described in detail with reference to FIGS. 4A to 4F.

A novel structure of each stacked capacitor memory cell involved in a dynamic random access memory will be described with reference to FIG. 4F. The novel stacked capacitor memory cell for the dynamic random access memory device of the second embodiment has an analogous structure to that of the first embodiment, except for a stacked capacitor. The stacked capacitor memory cell has a p-type silicon substrate 201. A field oxide film 202 is selectively formed in a surface of the p-type silicon substrate 201 thereby an active region which comprises an exposed surface of the p-type silicon substrate 201 is defined. Namely, the opposite surface region to the active region in the p-type silicon substrate 201 is covered with the field oxide film 202. A gate oxide film 203 is formed in a predetermined region of the active region in the surface of the p-type silicon substrate 201. A gate electrode 204 exists directly over the gate oxide film 203. The active region, except for a covered area by the gate oxide film 203, is occupied by source and drain diffusion regions 205-1 and 205-2 of n-type. Thus, a transistor which comprises the n-type source and drain diffusion regions 205-1 and 205-2 and the gate electrode 204 is formed on the active region in the surface of the p-type silicon substrate 201.

A first inter-layer insulator 206 which comprises an insulation film overlies not only the field oxide film 202 but also the transistor for memory cell thereby the n-type source or drain diffusion region 205-2 and the gate electrode 204 are covered by the first inter-layer insulator 206. The first inter-layer insulator 206, however, has a contact hole which exists directly over the source or drain diffusion region 205-1 in the transistor. Further, a second inter-layer insulator 207 overlies the first inter-layer insulator 206. The second inter-layer insulator 207, however, has a through hole which exists directly over the contact hole of the first inter-layer insulator 206. The through hole of the second inter-layer insulator 207 has a much larger diameter than a diameter of the contact hole of the first inter-layer insulator 206. Both the contact hole of the first inter-layer insulator 206 and the through hole of the second inter-layer insulator 207 have respectively vertical side walls. Thus, a part of the first inter-layer insulator 206 is exposed but only in the vicinity of the contact hole. The second inter-layer insulator 207 has a much larger thickness than a thickness of the first inter-layer insulator 206. Thus, the n-type source or drain diffusion region 205-1 is exposed through both the contact hole of the first inter-layer insulator 206 and the through hole of the second inter-layer insulator 207.

A stacked capacitor of the memory cell is formed in both the contact hole of the first inter-layer insulator 206 and the through hole of the second inter-layer insulator 207. A storage electrode 208 of the stacked capacitor is formed in both the contact hole of the first inter-layer insulator 206 and the through hole of the second inter-layer insulator 207. For example, the storage electrode 208 which comprises a polycrystalline silicon film so occupies the through hole as to both overlay the vertical side wall of the through hole and exist at the center portion of the through hole. Namely, the storage electrode 208 within the through hole has an aperture between its part overlaying the vertical side wall of the through hole and its other part existing at the center portion of the through hole, provided that the storage electrode 209 overlays the bottom portion of the through hole. A part of the storage electrode 208 which exists at the center portion of the through hole has both a vertical wide wall and a top portion having a height equal or near to a height of the second inter-layer insulator 207. The aperture in the storage electrode 208 is defined by both the vertical side wall of the part of the storage electrode 208 at the center portion of the through hole and the part of the storage electrode 208 on the vertical side wall of the through hole. The part of the storage electrode 208 at the center portion of the through hole has a diameter not much larger than the diameter of the contact hole formed in the first inter-layer insulator 206. The storage electrode 208 further occupies the contact hole of the first inter-layer insulator 206 without aperture so as to make the storage electrode 208 into contact with the source or drain diffusion region 205-1 electrically through the contact hole.

A capacitive insulation film 209 which comprises an insulation film for the stacked capacitor overlies the storage electrode 208 which is formed in both the through hole and the contact hole of the second and first inter-layer insulators 207 and 206 respectively. Since the contact hole of the first inter-layer insulator 206 is completely occupied with the storage electrode 208, the capacitive insulation film 209 of the stacked capacitor exists only within the through hole formed in the second inter-layer insulator 207. For example, the capacitive insulation film 209 overlies the part of the storage electrode 208 on the vertical side wall of the through hole. The capacitive insulation film 209 further overlies the part of the storage electrode 208 on the bottom portion of the through hole. The capacitive insulation film 209 further more overlies the vertical side wall and the top portion of the part of the storage electrode 208 at the center portion of the through hole. Although the aperture of the storage electrode 208 is overlaid by the capacitive insulation film 209, the aperture which is defined by the capacitive insulation film 209 still remains.

An opposite electrode 210 which comprises a polycrystalline silicon film for the stacked capacitor overlays the capacitive insulation film 209 for the stacked capacitor. For example, the opposite electrode 210 of the stacked capacitor completely occupies the aperture which is defined by the capacitive insulation film 209. The opposite electrode 210 further exists over the top portion of the center part of the storage electrode 208 through the capacitive insulation film 209 and over the occupied aperture, in addition in the vicinity thereof. Thus, the opposite electrode 210 exists within and over the through hole formed in the second inter-layer insulator 207.

The stacked capacitor has a large area of interfaces of the capacitive insulation film 209 to both the storage electrode 208 and the opposite electrode 210 so as to allow the stacked capacitor to possess a large capacitance under a small occupied area. Actually, such stacked capacitor of the second embodiment has a large interface area and thus a large capacitance as compared to the stacked capacitor of the first embodiment.

A third inter-layer insulator 211 covers an entire surface of the device, and thus the stacked capacitor and the second inter-layer insulator 207. The third inter-layer insulator 211 has an insufficient difference in level over the stacked capacitor. Such insufficient difference in level of the third inter-layer insulator 211 is caused by a total thickness of both the capacitive insulation film 209 and the opposite electrode 210. The existence of the stacked capacitor in the through hole of the second inter-layer insulators 107 allows the third inter-layer insulator 211 over the stacked capacitor to be free from a large or remarkable difference in level. The capacitive insulation film 209 which generates a capacitance has a vertical double layer structure being separated by the opposite electrode 210. This is why a sufficient thickness of the second inter-layer insulator 207 permits the vertical side wall of the through hole of the second inter-layer insulator 207 to have a large area which provide a large capacitance to the stacked capacitor under the condition of a small occupied area.

Previous to an investigation of advantages provided from such novel structure of the stacked capacitor memory cell for the dynamic random access memory device, a fabrication method of the novel stacked capacitor cell will subsequently be described with reference to FIGS. 4A to 4F.

Figure 4A:
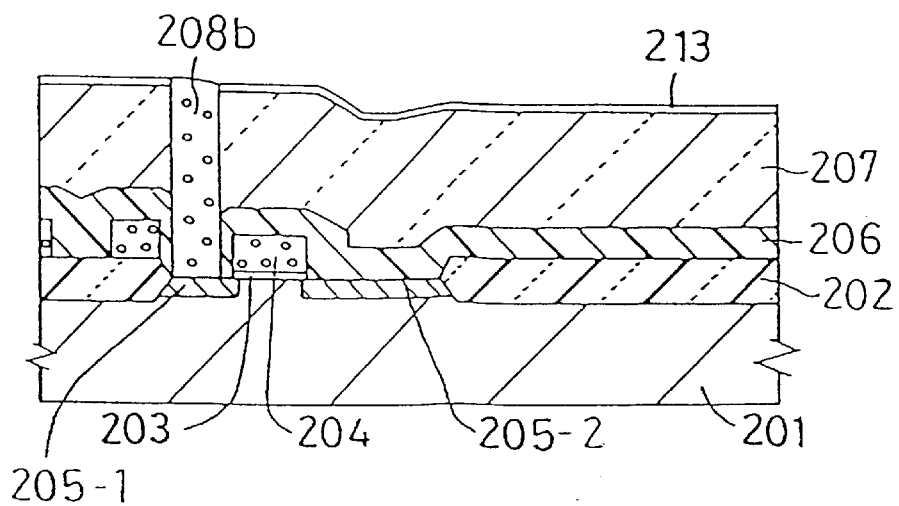
FIGS. 4A to 4F are fragmentary cross sectional elevation views illustrative of sequential steps involved in a novel fabrication method of a stacked capacitor memory cell for a random access memory device of a second embodiment according to the present invention.

With reference to FIG. 4A, the p-type silicon substrate 201 is prepared for a subsequent process of local oxidation of silicon (LOCOS) thereby the field oxide film 202 is selectively formed in a surface region except for an active region of the p-type silicon substrate 201. Thus, the active region of the surface of the p-type silicon substrate 201 is defined and isolated by the field oxide film 202. Ion-implantation to the active region in the surface of the p-type silicon substrate 201 is accomplished for controlling a threshold voltage of a transistor.

The active region in the surface of the p-type silicon substrate 201 is subjected to a thermal oxidation so that the gate oxide film 203 is formed on the active region. A polycrystalline silicon film is grown on the gate oxide film 203 for a subsequent phosphorus diffusion into the polycrystalline silicon film such as to make the polycrystalline silicon film have a desired low resistivity. After that, the gate oxide film 203 and the polycrystalline silicon film are subjected to such a patterning by photo-lithography as to make the gate oxide film 203 and the polycrystalline silicon film remain on a predetermined region only in the active region. The remaining polycrystalline silicon film serves as the gate electrode 204.

Ion-implantation of n-type dopant and a subsequent diffusion are accomplished by a normal process such as self-alignment technique so that lightly doped diffusion regions of $n^-$-type are formed in the active region except for a surface region directly under the gate oxide film. Subsequently, side wall oxide films which are not illustrated are formed at opposite side portions of the gate electrode 204. After that, an ion-implantation of n-type dopant and a subsequent diffusion are accomplished by a normal process such as self-alignment technique so that the $n^+$-type diffusion regions 105-1 and 105-2 are formed in the $n^-$-type lightly doped diffusion regions so that the $n^-$-type lightly doped diffusion regions remain only at potions directly under the side wall oxide films. As a result, the n-type source and drain diffusion regions 105-1 and 105-2 which includes a lightly doped drain structure are formed thereby a channel region of the transistor is defined. Consequently, a filed effect transistor which serves as a switching device for the memory cell is formed in the active region. The lightly doped drain structure of any of the n-type source and drain diffusion regions 105-1 and 105-2 is able to reduce a maximum electric field appearing at a drain side so as to prevent both a generation of hot carriers and a subsequent injection of the hot carriers into the gate oxide film. Such lightly doped drain structure of each of the n-type source and drain diffusion regions 105-1 and 105-2 allows a scaling down of a channel length of the field effect transistor.

The first inter-layer insulator 206 which comprises a silicon oxide film is grown on an entire surface of the device so as to cover not only the transistor in the active region but the field oxide film 202. The second inter-layer insulator 207 which comprises a boro-phospho silicate glass film (BPSG film) is further grown on the first inter-layer insulator 206 for a subsequent re-flow process for leveling the surface of the second inter-layer insulator 207. A silicon nitride film 213 is grown on the second inter-layer insulator 207.

Subsequently, a contact hole is formed at a portion directly over the source or drain diffusion region 205-1 in the above triple insulation films, for example, the first and second inter-layer insulators 206 and 207 and the silicon nitride film 213. As a result, a part of the source or drain diffusion region 205-1 is exposed through the contact hole. A polycrystalline silicon film 208b being doped with phosphorus and having a thickness of approximately 600 nanometers is grown on an entire surface of the device so that the polycrystalline silicon film 208b completely occupies the contact holes formed in the first and second inter-layer insulators 206 and 207 as well as in the silicon nitride film 213. Thus, the polycrystalline silicon film 208b within the contact hole is made into contact with the exposed surface of the source or drain diffusion region 205-1 electrically. After that, the polycrystalline silicon film 208b is subjected to such an etch-back as to remain only within the contact hole formed in the first and second inter-layer insulators 206 and 207 as well as in the silicon nitride film 213.

Figure 4B:
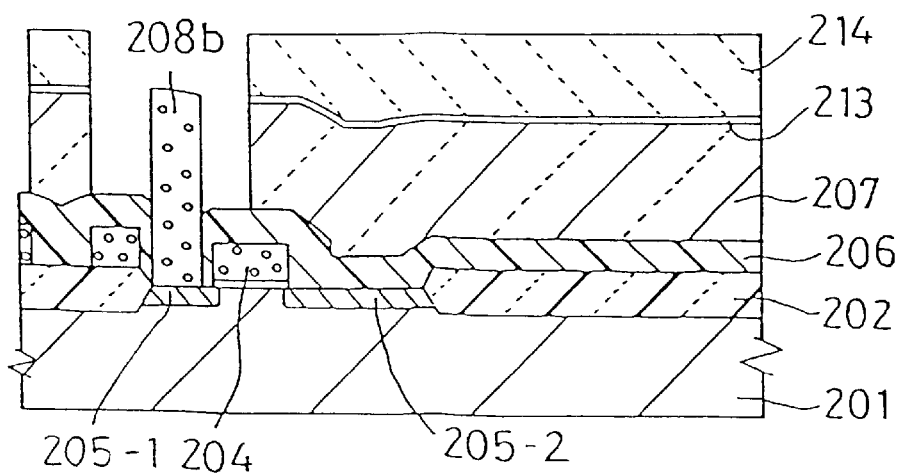

With reference to FIG. 4B, a photo-resist 214 which has been patterned is prepared for a subsequent alignment of the photo-resist 214 on the silicon nitride film 213 such that an opening of the photo-resist 214 exists directly over and in the vicinity of the remaining polycrystalline silicon film 208b. A diameter of the opening of the photo-resist 214 is larger than a diameter of the contact hole. A dry etching to the silicon nitride film 213 and the second inter-layer insulator 207 is accomplished by using the patterned photo-resist 214 as a mask so that the silicon nitride film 213 and the second inter-layer insulator 207 but only directly under the opening of the patterned photo-resist 214 are selectively removed. As a result, a through hole is formed in the second inter-layer insulator 207 directly under the opening of the photo-resist 214. Although the silicon nitride film 213 and the second inter-layer insulator 207 are etched, the polycrystalline silicon film 208b remains. Thus, a diameter of the through hole formed in the second inter-layer insulator 207 is defined by a diameter of the opening of the patterned photo-resist 214. An etching rate of the boro-phospho silicate glass film serving as the second inter-layer insulator 207 is larger than an etching rate of the silicon oxide film serving as the first inter-layer insulator 206. Thus, a suitable adjustment of a time for the above dry etching allows the first inter-layer insulator 206 to remain thereby a surface of the first inter-layer insulator is partially exposed through the through hole of the second inter-layer insulator 207 and the opening of the patterned photo-resist 214. The through hole formed in the second inter-layer inter-layer insulator 207 has a vertical side wall having a large height which is defined by the thickness of the second inter-layer insulator 207. As a result, an aperture which is defined by both the vertical side wall of the through hole and the remaining polycrystalline silicon film 208b is formed after the etching. A part of the remaining polycrystalline silicon film 208b is projected over the first inter-layer insulator 206. After a completion of the above dry etching process, the photo-resist 214 is removed.

Figure 4C:
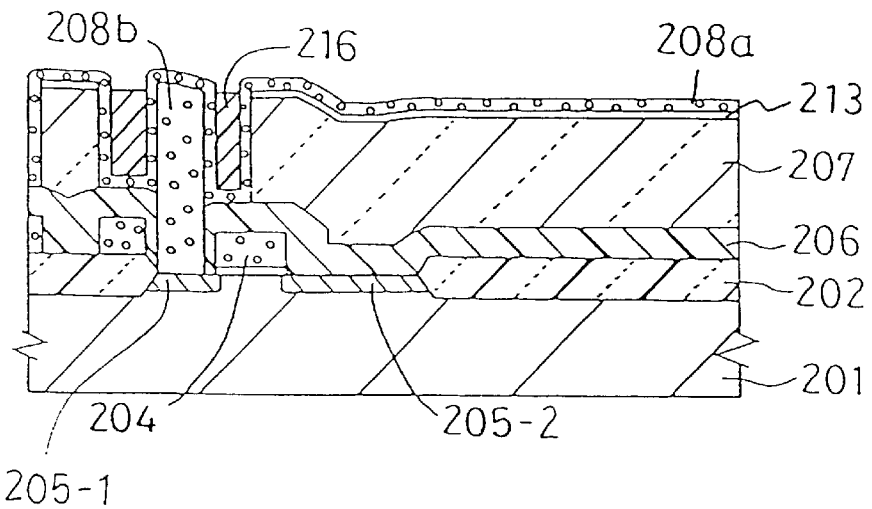

With reference to FIG. 4C, a polycrystalline silicon film 108a having a thickness of approximately 100 nanometers is grown on an entire surface of the device so as to cover not only the silicon nitride film 213 but also a surface of through hole formed in the second inter-layer insulator 207. Namely, the polycrystalline silicon film 208a covers not only the vertical side wall and the bottom portion of the through hole but also the exposed surface of the remaining polycrystalline silicon film 208b over the first inter-layer insulator 206.

Subsequently, a low pressure chemical vapor deposition (LPCVD) of silicon oxide is accomplished thereby a silicon oxide film 216 having a thickness of approximately 300 nanometers is grown on the polycrystalline silicon film 208a. As a result, the silicon oxide film 116 fills the aperture of the polycrystalline silicon film 208a within the through hole. An entire surface of the deposited silicon oxide film 216 is subjected to such an etch-back that the silicon oxide film 116 is removed partially and remain only within the aperture in the through hole of the second inter-layer insulator 207.

Figure 4D:
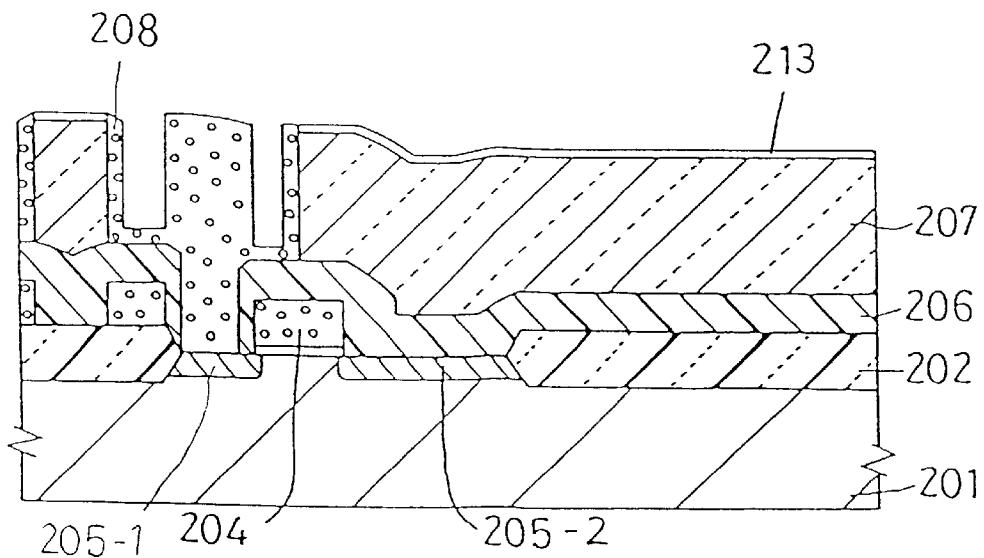

With respect to FIG. 4D, an etching to the polycrystalline silicon film 208a is accomplished by using the remaining silicon oxide film 216 within the through hole as a mask so that the polycrystalline silicon film 208a is subjected to such a patterning as to remain within the through hole. Thus, the polycrystalline silicon film 108a on the silicon nitride film 213 is removed thereby a surface of the silicon nitride film 213 is exposed. The remaining polycrystalline silicon films 208a and 208b serve as the storage electrode 208 for the stacked capacitor. After a completion of the etching, the oxide film 216 within the through hole are removed by etching. At this time, the silicon nitride film 213 having a resistivity to the etching serves to protect the second inter-layer insulator 207 which comprises the boro-phospho silicate glass film from the etching.

Figure 4E:
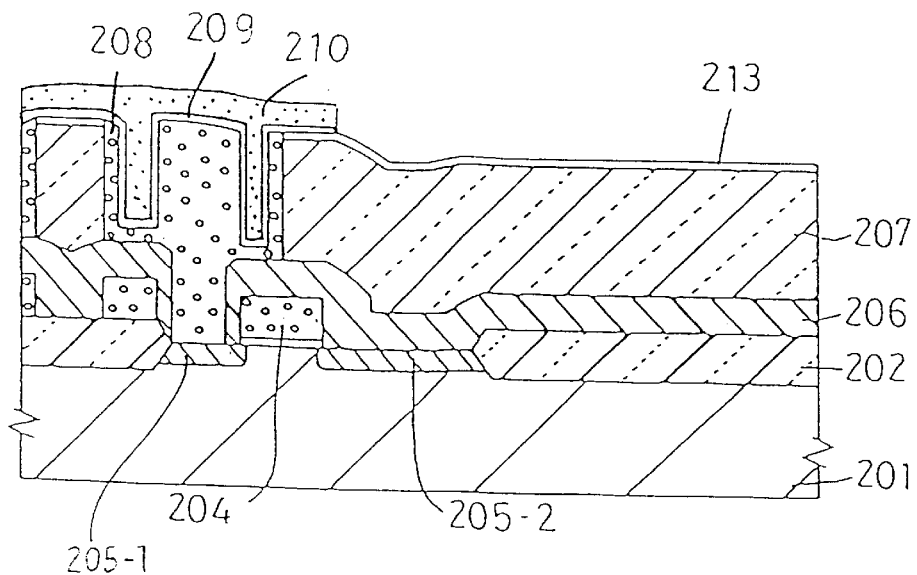
Figure 4F:
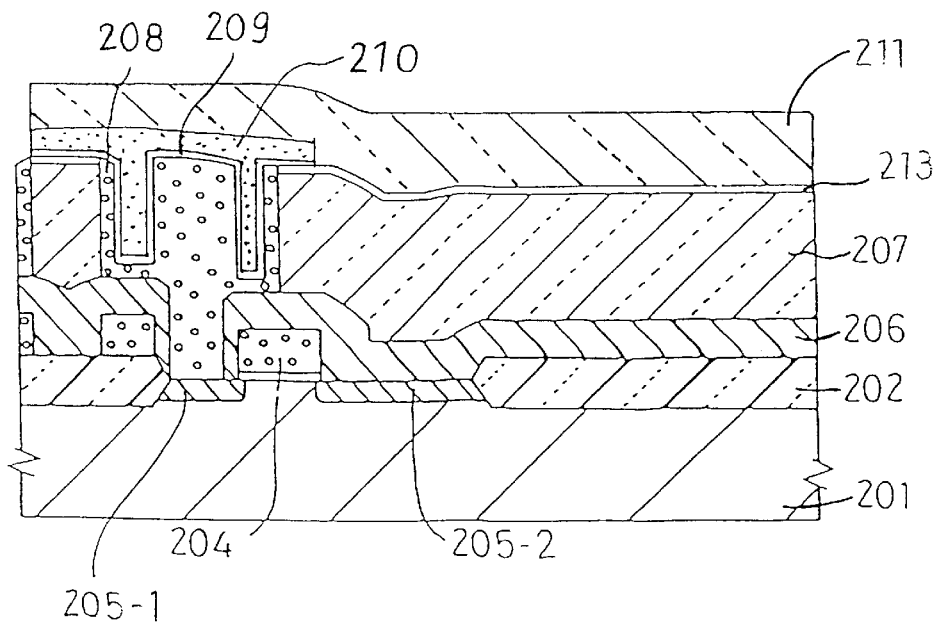

With respect to FIG. 4E, a silicon nitride film is grown on an entire surface of the device so as to cover not only the silicon nitride film 213 but also the storage electrode 208 of the stacked capacitor within the though hole for a subsequent thermal oxidation to the surface of the silicon nitride film thereby a silicon oxide film is formed on the surface of the silicon nitride film. As a result, a silicon oxide film covers not only the silicon nitride film 213 but the storage electrode 208. Further, a polycrystalline silicon film is grown on an entire surface of the device, and thus on the surface of the silicon oxide film for a subsequent doping of dopant into the polycrystalline silicon film such that the polycrystalline silicon film has a desirable resistivity. After that, the polycrystalline silicon film, the silicon oxide film and the silicon nitride film are subjected to such a patterning as to remain within and in the vicinity of the through hole. As a result, the capacitive insulation film 209 and the opposite electrode 210 are respectively formed on the storage electrode 208. The stacked capacitor, thus, comprises the storage electrode 208, the capacitive insulation film 209 overlaying the storage electrode 208 and the opposite electrode 210 overlaying the capacitive insulation film 209. The capacitive insulation film 209 has the double layer structure at opposite sides of the center portion of the storage electrode 208. This allows the stacked capacitor to have a large area of the interface between the capacitive insulation film 209 and the storage electrode 208 or the opposite electrode 210. This is why the stacked capacitor has a large capacitance with a small occupied area.

With reference back to FIG. 2F, a silicon oxide film is grown on an entire surface of the device so as to cover not only the silicon nitride film on the second inter-layer insulator 207 but also the stacked capacitor, for example, the opposite electrode 210. Further, a boro-phospho silicate glass film is grown on the silicon oxide film for a subsequent heat treatment to make the boro-phospho silicate glass film exhibit a re-flow thereby resulting in a reduction of a difference in level of the surface of the boro-phospho silicate glass film. As a result, the third inter-layer insulator 211 having an insufficient difference in level is formed.

Subsequently, the following steps will be accomplished, although illustrations are omitted. A plurality of bit-lines which comprise wiring layers made of polycide are formed on the third inter-layer insulator 211. A contact hole is formed in the first, second and third inter-layer insulators 206, 207 and 211. Each of the plural bit lines is electrically connected to the n-type source or drain diffusion region 205-2 through the contact hole. An inter-layer insulator is formed on the polycide wiring layer serving as the bit-lines. After that, a plurality of word-lines which comprise wiring layers made of aluminium are formed on the inter-layer insulator over the bit-lines. A contact hole is formed in the top inter-layer insulator, the first, second and third inter-layer insulators 206, 207 and 211. Each of the plural word-lines is electrically connected to the polycrystalline silicon film serving as the gate electrode 204 through the contact hole. A passivation film is so formed as to cover the entire surface of the device including the word-lines thereby resulting in a completion of a formation of the stacked capacitor cell for the dynamic random access memory.

Digital signals are transmitted through the bit-lines to the source or drain diffusion region 205-2 of the transistor. If the transistor takes ON state, the digital signal is transmitted through the channel region to the source or drain diffusion region 205-1 and subsequently appears at the storage electrode 208 of the stacked capacitor. The digital signal is stored in the storage capacitor during OFF state of the transistor.

Advantages of the novel stacked capacitor cell for the dynamic random access memory device provided by the second embodiment according to the present invention will be investigated in detail.

As describe above, the stacked capacitor is formed in the through hole of the second inter-layer insulator 207. The stacked capacitor has a large area of the interface between the capacitive insulation film 209 and the storage electrode 208 or the opposite electrode 210. This allows the staked capacitor to have a large capacitance under a small occupied area. Further, the height of the vertical side wall of the through hole formed in the second inter-layer insulator 207 is defined by the thickness of the second inter-layer insulator 207. A variation of the thickness of the second inter-layer insulator 207 is permissive in view of a device design. It is possible to enlarge the capacitance of the stacked capacitor by an enlargement of the height of the vertical side wall of the through hole and thus an enlargement of the thickness of the second inter-layer insulator 207. Since the capacitive insulation film 209 for the stacked capacitor has the double layer structure at opposite sides of the center portion of the storage electrode 208, the enlargement of the capacitance of the stacked capacitor caused from the enlargement of the thickness of the second inter-layer insulator 207 is remarkable as compared to that in the first embodiment. Actually, the capacitance of the stacked capacitor of the second embodiment is larger than that of the capacitance of the capacitor of the first embodiment. The capacitance of the stacked capacitor is controllable by controlling the thickness of the second inter-layer insulator 207.

The insufficient difference in level of the surface of the third inter-layer insulator 211 is caused by the total thickness of the capacitive insulation film 209 and the opposite electrode 210 of the stacked capacitor. Further, the third inter-layer insulator 211 was subjected to a heat treatment which makes the boro-phospho silicate glass film of the third inter-layer insulator 211 exhibit a re-flow thereby resulting in a reduction of the insufficient difference in level of the surface of the third inter-layer insulator 211, and thus the leveling thereof is further improved. Such extremely insufficient difference in level of the third inter-layer insulator 211 allows layers over the third inter-layer insulator 211 such as the bit-lines and the word-lines to be free from having a difference in level thereof. Namely, an excellent leveling for the bit-lines and the word-lines and the other layers over the third inter-layer insulator 211 is realized. This makes the bit-lines and the word-lines free from any disconnection which is caused from a relatively large difference in level thereof. Further, such excellent leveling of the layers such as the bit-lines and the word-lines is able to keep any layer to be exposed to patterning of the photo-lithography from suffering any inferiority in the accuracy of patterning which is caused from a difference in level of a surface of the layer. This results in an improvement in the accuracy of the patterning in the photo-lithography. Such improvement in the accuracy of the patterning of the photo-lithography permits a further scaling down of the stacked capacitor cell for the dynamic random access memory device. This is why a high integration of the stacked capacitor memory cell array of the dynamic random access memory device is improved. Further, a reliability of the stacked capacitor memory cell is improved. Furthermore, a yield of the dynamic random access memory device is improved.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the spirit and scope the invention.

What is claimed is:

1. A stacked capacitor cell structure for a semiconductor memory device comprising:

a semiconductor substrate;

a field oxide film being selectively formed in a surface region of said semiconductor substrate so as to define an active region in said surface region of said semiconductor substrate;

a transistor having a diffusion region formed in said active region;

a first interlayer insulator overlying both said transistor and said field oxide film, said first interlayer insulator having a contact hole with a diameter, said contact hole exposing a part of said diffusion region of said transistor;

a second interlayer insulator overlying said first interlayer insulator, said second interlayer insulator both having a through hole with a larger diameter than said diameter of said contact hole and having a greater thickness than said first interlayer insulator and said field oxide film, said through hole thereby exposing a part of said first interlayer insulator around said contact hole;

a stacked capacitor formed within said through hole formed in said second interlayer insulator, said stacked capacitor comprising a storage electrode formed in contact with said part of said diffusion region of said transistor via said through hole and said contact hole in which a capacitive insulation film overlying said storage electrode and an opposite electrode overlying said capacitive insulation film; and a third interlayer insulator overlying both said stacked capacitor and said second interlayer insulator.

2. The cell structure as claimed in claim 1, wherein said storage electrode, said capacitive insulation film and said opposite electrode are formed along respective surfaces of said though hole and said contact hole.

3. The cell structure as claimed in claim 1, wherein
said storage electrode comprises a first portion formed on a surface of said through hole, a second portion formed at a center portion of said through hole and a third portion formed within said contact hole in which said first and second portions form an aperture;
said capacitive insulation film overlies respective surfaces of said first and second portions of said storage electrode; and
said opposite electrode overlies said capacitive insulation film.

4. The cell structure as claimed in claim 1, wherein said third inter-layer insulator has a variation in height above said substrate which is less than the combined thickness of said capacitive insulation film and said opposite electrode.

5. The cell structure as claimed in claim 4, wherein said third inter-layer insulator includes a layer made of boro-phospho silicate glass, said layer having been subjected to a re-flow treatment for an improvement in leveling said surface of said third inter-layer insulator.

6. The cell structure as claimed in claim 1, wherein said third inter-layer insulator is a continuous layer that extends continuously above said stacked capacitor.

* * * * *